United States Patent [19]

Iinuma

[11] Patent Number: 4,499,498
[45] Date of Patent: Feb. 12, 1985

[54] RUN LENGTH DECODING APPARATUS

[75] Inventor: Kazumoto Iinuma, Tokyo, Japan

[73] Assignee: Nippon Electric Co., Ltd., Tokyo, Japan

[21] Appl. No.: 456,034

[22] Filed: Jan. 6, 1983

[30] Foreign Application Priority Data

Jan. 14, 1982 [JP] Japan .................................. 57-3403
Jan. 14, 1982 [JP] Japan .................................. 57-3404

[51] Int. Cl.³ .............................................. H04N 1/00
[52] U.S. Cl. .................................................... 358/261
[58] Field of Search ......................................... 358/261

[56] References Cited

U.S. PATENT DOCUMENTS 4,223,356 9/1980 Renelt et al. ......................... 358/261
4,228,467 10/1980 de Loye et al. ...................... 358/261
4,360,840 11/1982 Wolfrum et al. .................... 358/261

Primary Examiner—John C. Martin
Assistant Examiner—Edward L. Coles
Attorney, Agent, or Firm—Blakely, Sokoloff, Taylor & Zafman

[57] ABSTRACT

In a run length decoding apparatus of the type comprising a decoding circuit decoding a series of run length encoded data to sequentially output binary data indicative of respective run lengths, and decoding means for decoding a white or black signal having a number of bits represented by an output value of the decoding circuit so as to sequentially accumulate decoded signals in a picture memory device, there are provided a lower order counter to be set with a surplus less than n (an integer larger than 2) of the output value of the decoding circuit, an upper order counter to be set with an upper order value, count of the upper order counter being decremented according to a clock pulse, a selector which, in response to a carry signal outputted by the upper order counter, selects and outputs either one of a fixed value n and an output signal of the lower order counter at each clock pulse, a flip-flop circuit whose state is reversed at each one run length, and an array conversion circuit inputted with decoded data outputted from the flip-flop circuit and a number of effective data outputted from the selector to sequentially array effective decoded data for outputting them as parallel data each having more than n bits.

3 Claims, 9 Drawing Figures

| RUN LENGTH | CODE WORD | CODE LENGTH |
|---|---|---|
| 1 | 0 1 0 | 3 |
| 2 | 1 1 | 2 |
| 3 | 1 0 | 2 |
| 4 | 0 1 1 | 3 |
| 5 | 0 0 1 1 | 4 |
| 6 | 0 0 1 0 | 4 |
| 7 | 0 0 0 1 1 | 5 |
| 8 | 0 0 0 1 0 1 | 6 |
| 9 | 0 0 0 1 0 0 | 6 |
| 10 | 0 0 0 0 1 0 0 | 7 |
| 11 | 0 0 0 0 1 0 1 | 7 |
| 12 | 0 0 0 0 1 1 1 | 7 |
| 13 | 0 0 0 0 0 1 0 0 | 8 |
| 14 | 0 0 0 0 0 1 1 1 | 8 |
| 15 | 0 0 0 0 1 1 0 0 | 8 |
| EOL | 0 0 0 0 0 0 0 1 | 8 |

| $A_7$~$A_4$ | 0 0 0 0 | | | | 0 0 0 1 | | | | 0 0 1 0 | | | |
|---|---|---|---|---|---|---|---|---|---|---|---|---|
| $A_3 A_2 A_1 A_0$ | RUN LENGTH | LOAD | CODE LENGTH | EOL | RUN LENGTH | LOAD | CODE LENGTH | EOL | RUN LENGTH | LOAD | CODE LENGTH | EOL |
| 0 0 0 0 | 2 | 1 | 4 | 1 | 9 | 0 | 2 | 1 | | | | |
| 0 0 0 1 | 1 | 1 | 4 | 1 | 9 | 0 | 2 | 1 | 0 | 0 | 4 | 0 |
| 0 0 1 0 | 6 | 0 | 4 | 1 | 9 | 0 | 2 | 1 | | | | |
| 0 0 1 1 | 5 | 0 | 4 | 1 | 9 | 0 | 2 | 1 | | | | |
| 0 1 0 0 | 1 | 0 | 3 | 1 | 8 | 0 | 2 | 1 | 13 | 0 | 4 | 1 |
| 0 1 0 1 | 1 | 0 | 3 | 1 | 8 | 0 | 2 | 1 | | | | |
| 0 1 1 0 | 4 | 0 | 3 | 1 | 8 | 0 | 2 | 1 | | | | |
| 0 1 1 1 | 4 | 0 | 3 | 1 | 8 | 0 | 2 | 1 | 14 | 0 | 4 | 1 |
| 1 0 0 0 | 3 | 0 | 2 | 1 | 7 | 0 | 1 | 1 | | | | |
| 1 0 0 1 | 3 | 0 | 2 | 1 | 7 | 0 | 1 | 1 | | | | |
| 1 0 1 0 | 3 | 0 | 2 | 1 | 7 | 0 | 1 | 1 | 11 | 0 | 3 | 1 |
| 1 0 1 1 | 3 | 0 | 2 | 1 | 7 | 0 | 1 | 1 | 11 | 0 | 3 | 1 |
| 1 1 0 0 | 2 | 0 | 2 | 1 | 7 | 0 | 1 | 1 | 15 | 0 | 4 | 1 |
| 1 1 0 1 | 2 | 0 | 2 | 1 | 7 | 0 | 1 | 1 | | | | |
| 1 1 1 0 | 2 | 0 | 2 | 1 | 7 | 0 | 1 | 1 | 12 | 0 | 3 | 1 |
| 1 1 1 1 | 2 | 0 | 2 | 1 | 7 | 0 | 1 | 1 | 12 | 0 | 3 | 1 |

FIG.7

RUN LENGTH DECODING APPARATUS

BACKGROUND OF THE INVENTION

This invention relates to run length decoding apparatus which decodes a series of encoded data into original data.

Encoding of run lengths is used for compressing various data such as facsimile signals, and other data.

For example, a modified Huffman encoding system (MH encoding) utilized as the international standard facsimile system is a typical one.

In an ordinary facsimile system, it takes about 30 seconds for transmitting a manuscript of A4 size (300 mm×210 mm) so that even when an interval of the same order is necessary for decoding it is not necessary to decode at a higher speed. In a case where data compressed by run length encoding are stored in a memory device and the stored data are decoded when it is desired to display the decoded data on a television display device, the time necessary for decoding must be short.

A typical example of decoding compressed data of a A4 maniscript in 0.1 to 0.2 seconds will now be considered. Since the number of the picture elements per one scanning line is 1728 and since the number of the scanning lines per page is about 2300 the total number of the picture elements amounts to about 4 mega-bits. Supposing a data compression ratio of 10, the number of the compressed data would be 0.4 mega-bits. The process of decoding comprises a first step in which the compressed data are read out from the memory device and decoded, and then the decoded data are separated into data respectively representing individual white or black run lengths, and a second step in which decoded data corresponding to white and black of respective picture elements are generated from data representing the run lengths. Denoting the frequency of an operating clock pulse by f megahertz and supposing that one datum is decoded by one clock pulse, the time T1 required for the first step is 0.4/f seconds. Where decoded data of one picture element is produced by one clock pulse, the time T2 required for the second step is 4/f seconds. For example, where the clock frequency f is equal to 10 megahertz, T1=0.04 sec., and T2=0.4 sec., so that afore-mentioned target can not be reached. To attain the target value of 0.1 sec., it is necessary to increase the clock frequency to 40 megahertz, which requires a special, expensive and ultra high speed circuit element.

SUMMARY OF THE INVENTION

It is therefore an object of this invention to provide novel run length decoding apparatus capable of high speed decoding without using any ultra high speed circuit element.

According to this invention, there is provided run length decoding apparatus of the type comprising a decoding circuit which decodes a series of run length encoded data to sequentially output binary data indicative of respective run lengths, and means for decoding a white or black signal having a number of bits represented by an output value of the decoding circuit so as to sequentially accumulate decoded signals in a picture memory device, wherein there are provided a lower order counter to be set with a surplus less than n (an integer larger than 2) of the output value of the decoding circuit, an upper order counter to be set with an upper order value, contents of the upper order counter being decremented according to a clock pulse, a selector which, in response to a carry signal outputted by the upper order counter, selects and outputs either one of a fixed value n and an output signal of the lower order counter at each clock pulse, a flip-flop circuit whose state is reversed at each one run length, and an array conversion circuit inputted with decoded data outputted from the flip-flop circuit and a number of effective data outputted from the selector to sequentially array effective decoded data for outputting them as parallel data each having more than n bits.

According to a modified embodiment of this invention, there is provided a run length decoding apparatus of the type comprising a decoding circuit which decodes a series of run length encoded data to sequentially output binary data indicative of respective run lengths, and means for decoding a white or black signal having a number of bits represented by an output value of the decoding circuit so as to sequentially accumulate decoded signals in a picture memory device, wherein there are provided a lower order counter set with a surplus of less than n (an integer larger than 2) of the output value of the decoding circuit, an upper order counter to be set with an upper order value, a shift register for storing decoded data of the surplus having less than n bits, a surplus counter for counting a number of decoded data stored in the shift register, a flip-flop circuit whose output is reversed at each one run length, a selector having a 2n-bit output and a n-bit output and aplied with an output of the shift register and an output of the flip-flop circuit, a picture memory device written with the n-bit output of the selector and a logic circuit inputted with an output state of the upper order counter and an output state of the surplus counter for producing an output signal calculated by predetermined logic equations, the output signal controlling shift operation of the shift register, writing of the lower order and upper order counters and clearing of the surplus counter, whereby when the decoded data does not contain any surplus less than n bits and when the data to be decoded contains more than n bits, n bits of the decoded data are grouped and then written into the picture memory device, whereas in other cases data are decoded bit after bit and the decoded bits are accumulated in the shift register, and when a number of bits reaches n, the decoded data are written into the picture memory device with n bits in parallel.

BRIEF DESCRIPTION OF THE DRAWINGS

In the accompanying drawings:

FIG. 5 is a table showing one example of the run length codes;

FIG. 6 is a graph showing the decoding operation of the parallel decoding circuit shown in FIG. 4;

FIG. 7 is a table showing the content of the ROM 23 of the parallel decoding circuit shown in FIG. 4;

DESCRIPTION OF THE PREFERRED EMBODIMENTS

Figure 1:
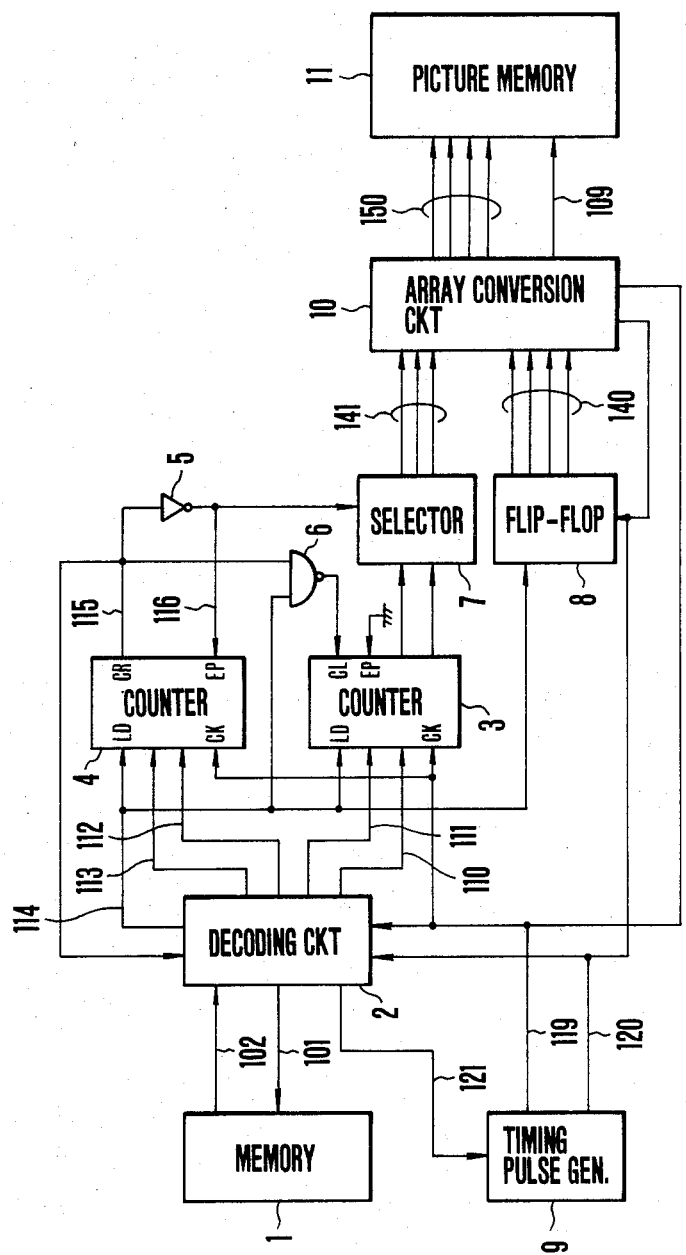
FIG. 1 is a block diagram showing one embodiment of this invention.

In a preferred embodiment of this invention shown in FIG. 1, a series of run length encoded data (hereinafter termed compressed data) stored in a memory device 1 are read out by a read out pulse 101 supplied from a decoding circuit 2. The output signal 102 from the memory device 1 is decoded by the decoding circuit 2 and the output thereof comprises individual run lengths expressed by binary digits. When the decoding circuit 2 is of the conventional type wherein when the bits of the output signal 102 are sequentially decoded, the overall decoding time is not affected by such sequential decoding if the compression ratio is high. For this reason, in this embodiment the conventional serial decoding circuit is used. (Since such decoding circuit is used as the MH decoding circuit of the present business facsimiles, its detailed description is not made herein).

Of the output signal of the decoding circuit 2, lower bit outputs 110 and 111 are supplied to a counter 3, whereas upper bit outputs 112 and 113 are supplied to a counter 4. These counters 3 and 4 temporarily store inputted bits in accordance with a load pulse 114 given from the decoding circuit 2. For simplifying the description, it is assumed that the maximum run length is 15, that the output signal from the decoding circuit 2 comprises 4 bits, and that the number n of the parallel bits to be simultaneously written into a memory device 11 to be described later is 4. Then as described above, of the output signals of the decoding circuit 2, the lower 2-bit outputs 110 and 111 are stored in the counter 3, and the upper 2-bit outputs 112 and 113 are stored in the counter 4. Where the white or black decoded data comprising N continuous bits obtained by decoding the run lengths N are to be generated as k (an integer) parallel data each having n (an integer larger than 2) bits, and parallel data each having q (a fraction less than 2) bits, the lower bit counter 3 would store the fraction q and the upper bit counter 4 would store k. For example, where N=11 and n=4, then k=2 and q=3 so that the counter 4 would store 2, while the counter 3 store 3. More particularly, since the output of the decoding circuit 2 is binary "1011" the lower two bits "11" are stored in the counter 3 and the upper two bits "10" in the counter 4. The counters 3 and 4 are of the synchronous type so that data are stored in the counters at the time of rising of a next clock pulse when a load pulse is applied. As the counters, may be used integrated circuits μPB 74163 and μPB 74669 sold by the assignee of this invention.

The counter 4 produces at its carrier output terminal CR a carrier signal 115 of "1" when the count thereof is zero, while outputs a logic value "0" when the counts are other than zero. When a signal "1" is applied to a count enabling terminal EP, the counter 4 decreases or decrements its count by one in accordance with a clock pulse 119 applied to a clock terminal CK. As a result of the subtraction, when the count of the counter 4 decreases to zero, the carrier signal 115 changes to "1". an inverter 5 inverts this carrier signal 115 to "0" which is applied to a count enabling terminal EP so as to stop the counting operation. As a consequence, for example, when 2 is loaded in the counter 4, the count enabling signal becomes "1" for two clock periods (generally speaking it becomes "1" only for k clock periods). On the other hand, since the count enabling terminal EP is grounded, the counter 3 does not decrement according to the clock pulse. In other words, the counter 3 holds the data stored therein until it is cleared when the carrier signal 115 becomes "1" so that a signal "0" is inputted to the clear terminal CL via a NAND gate circuit 6. The counter 3 may be substituted by a register.

A two-bit output of the counter 3 and the output of the inverter 5 are applied to a selector 7 which outputs a fixed value "100" (4 in decimal representation) when the output of the inverter 5 is "1" and which selects and outputs the output of the counter 3 when the output of the inverter 5 is "0". The output of the selector 7 represents the effective number of the decoded data. A flip-flop circuit 8 is provided which is triggered by the load pulse outputted by the decoding circuit 2 to alternatively output "1" and "0" at each load pulse (corresponding to white and black). The flip-flop circuit 8 has four output lines which simultaneously become "1" or "0". Thus, the decoded data corresponding to the white and black picture elements are simultaneously outputted each comprising 4 bits (in a certain case the data contain invalid data).

The array conversion circuit 10 arranges the 4-bit output data 140 (generally, n bits) of the flip-flop circuit 8 according to the order of generation of the data 140 in accordance with the number of effective data represented by the output signal 141 of the selector 7 so as to parallelly output arranged data each consisting of 4 bits. (generally L bits) as will be described later in detail. A picture memory device 11 is written with the 4-bit parallel decoded data 150 outputted from the array conversion circuit 10 in acordance with a write pulse 109 produced by the array conversion circuit 10.

A timing pulse generator 9 is provided to output a clock pulse 119 and a line start pulse 120. The clock pulse 119 is used to operate various circuit elements according to predetermined timings, while the line start pulse 120 is used to reset the flip-flop circuit 8 and the array conversion circuit 10 so as to start the operation of the decoding circuit 2. The timing pulse generator 9 is applied with an one line termination signal 121 from the decoding circuit 2 to produce the line start pulse 120. The carry signal 115 outputted from the counter 4 is fed back to the decoding circuit 2. When the carry signal 115 becomes "1", the decoding circuit 2 notes that the generation of the decoded data has terminated to commence the next decoding operation. when the decoding circuit 2 decodes a code EOL representing the termination of one line, it sends out an one line termination signal 121 to the timing pulse generator 9.

Figure 2:
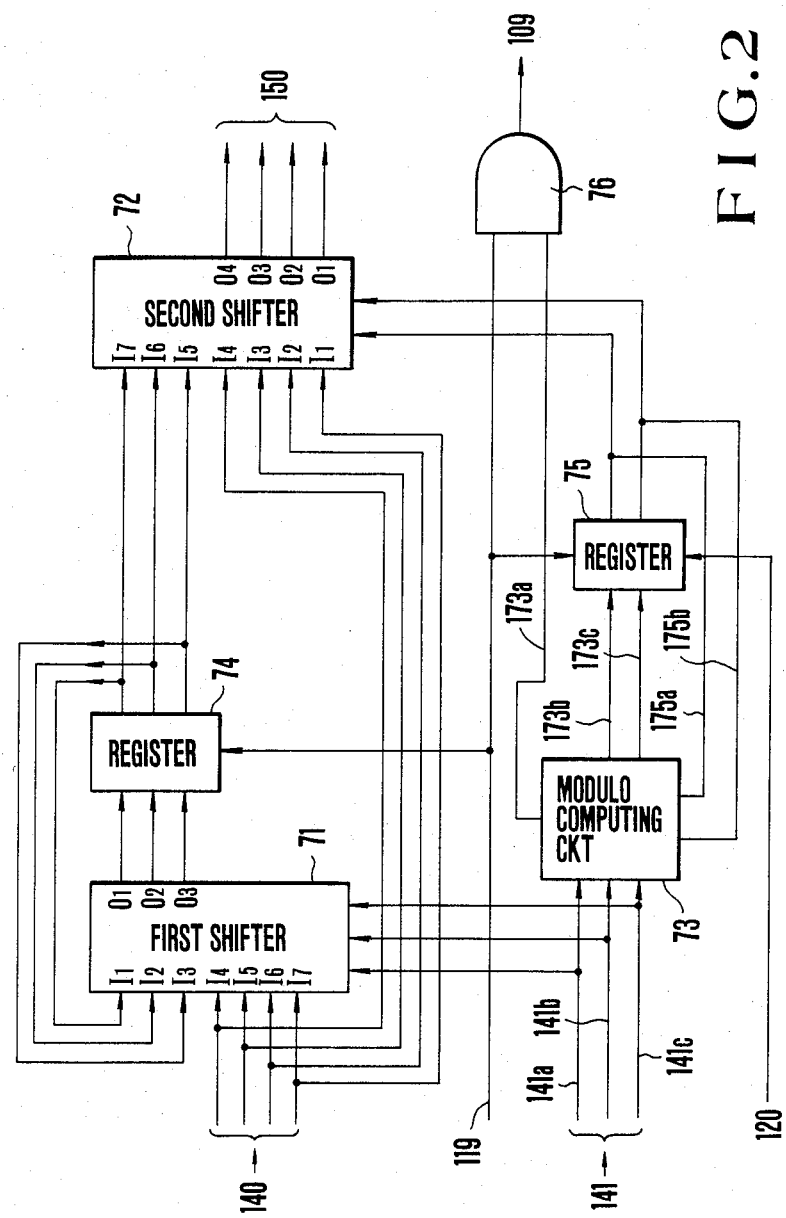
FIG. 2 is a block diagram showing one example of the construction of the array conversion circuit 10 shown in FIG. 1.

The array conversion circuit 10 is constructed as shown in FIG. 2, for example. More particularly, the 4-bit data 140 (including invalid data) outputted from the flip-flop circuit 8, and a signal 141 (3 bits) outputted from the selector 7 and showing the number m of the effective data are applied to a first shifter 71 and a modulo computing circuit 73. The shifter 71 shifts 3 consecutive terminals among seven input terminals I1 to I7 and connects the shifted input terminals to output terminals O1 to O3 respectively. The number of shifted terminals is determined by input signals 141. When the shift number is zero, the input terminals I1 to I3 are connected to output terminals O1 to O3, whereas when the shift number is 1, 2, 3 and 4, input terminals I2 to I4, I3 to I5, I4 to I6 and I5 to I7 are respectively connected to the output terminals O1 to O3. The output terminals O1 to O3 of the first shifter 71 are connected to a register 74 and the output terminals thereof are connected to the input terminals I7 to I5 of a second shifter 72 in a reverse order. The output terminals of the register 74 are connected to the input terminals I4 to I7 of the first shifter 71, and the decoded data 14 are applied to the input terminals I4 to I7 of the first shifter 71. The decoded data 140 are applied to the inputs I4 to I1 of the second shifter 72 in the reverse order. Each of the shifters 71 and 72 is of a type of a multiplexer that changes the connections between input lines and output lines and can be constituted by such a circuit element Am as an Advanced Micro Device Am 25S10 sold by Advanced Micro Device Company.

The signals 141 representing the number m of the effective data are used as shift control signals for the shifter 71 and inputted to a modulo computing circuit 73. The modulo computing circuit 73 adds together the output signals 175a and 175b from a register 75 and the effective data number m, and divides the sum by n. A fraction remaining after the division that is values less than n is stored in a register 75 as signals 173b and 173c which produce a carry signal 173a when the sum is larger than n. Where n=4 a conventional binary adder can be used. The register 75 produces a signal representing the number of the codes remaining after decoded data are outputted in 4-bit groups. When a gate circuit 76 is enabled by the carry signal 173a applied to one input, a write pulse 109 is outputted and sent to the memory device 11 shown in FIG. 1. The other input terminal of the gate circuit 76 is supplied with the clock pulse 119. The output signals from the register 75 are sent to the second shifter 72 to act as signals representing the shift number of the second shifter 72.

The embodiment described above operates as follows. An example wherein the beginning three picture elements of one line are white, the next eleven picture elements are black and the next ten picture elements are white will be described hereunder. When the timing pulse generator 9 generates a line start pulse shown at section (a) in FIG. 3, the decoding circuit 2 is started to initialize the flip-flop circuit 8 and the array conversion circuit 10. The decoding circuit 2 outputs a signal "0011" by decoding the first run length code as well as a load pulse 114 as shown at section (d) in FIG. 3. A binary signal "11" is loaded in the counter 3, while a binary signal "00" is loaded in the counter 4. The sum of the counts of the counters 3 and 4 (the count of the counter is 4 times) is shown at (g) in FIG. 3 as decimal digits. At this time, since the count of the counter 4 is zero, the carry signal 115 is still "0" as shown at (e) in FIG. 3 so that the decoding circuit 2 immediately begins to decode the next run length signal. Further, as the carry signal 115 is "1", the output of the inverter 5 is "0" so that the selector 7 selects the binary content "11" of the counter 3 and sends it to the array conversion circuit 10. Consequently, the number m of the effective data represented by the signal 141 becomes 3 as shown at (h) in FIG. 3.

At this time, although the output of the flip-flop circuit 8 is "0000", only three bits thereof are effective as the decoded data and the last one bit is made invalid data as will be described later. The output data (shown in FIG. 2) from the flip-flop circuit 140 are inputted to the input terminals I4 to I7 of the shifter 71. As shown at (e) in FIG. 3, the signal applied to the input terminals I4 to I7 of the shifter 71 is "000X". Actually "X" is "0", but later made invalid so that it is denoted by X for the purpose of discriminating it from other data. As a result of shift number 3, the input terminals I4 to I6 are connected to output terminals O1 to O3 respectively, thus storing "000" in the register 74.

Figure 3:
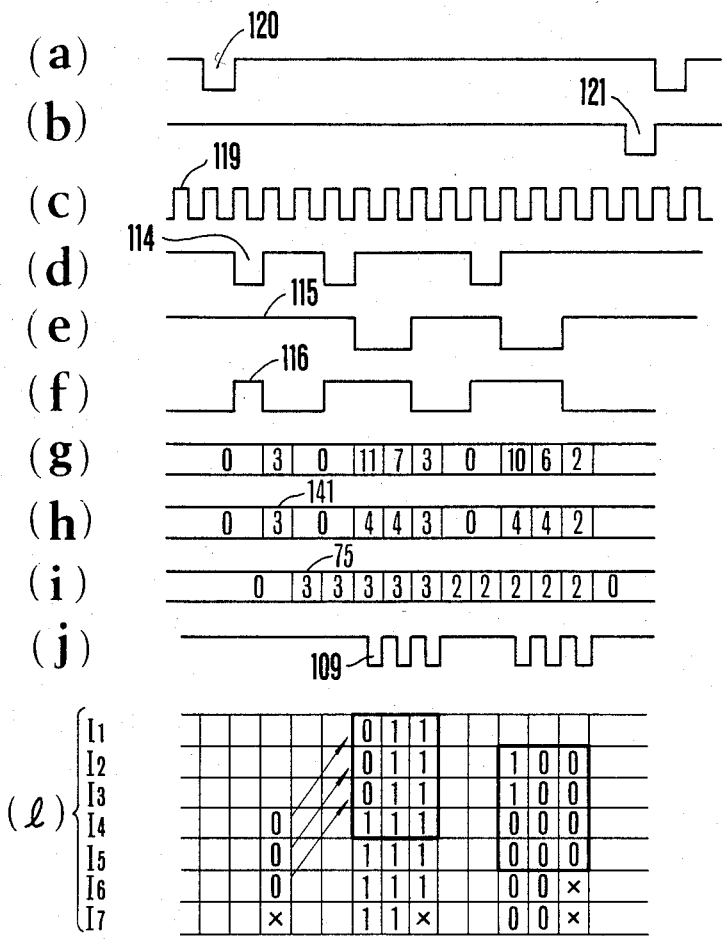
FIG. 3 is a timing chart showing signals at various parts of the circuit shown in FIG. 1 and is useful to explain the operation of the circuits.

The modulo computing circuit 73 (FIG. 2) adds the effective data number 3 represented by the signal 141 and the output value zero of the register 75 so as to store the resulting sum 3 in register 75 (see section (i) in FIG. 3). At this time, since the carry signal 173a is "0", no write pulse 109 is produced, and the register 75 is storing a surplus of 3. The remaining 3-bit decoded data are outputted from the output terminals O1, O2 and O3 via the input terminals I4, I5 and I6 of the first shifter 71 and stored in the register 74. The outputs of this register are fed back to the input terminals I1 to I3 of the first shifter 71 so that the data in the register 74 are continuously stored even when the shift number becomes zero.

Then the counter 3 is cleared by the next clock pulse to reduce its content to zero (see section (h) in FIG. 3) and the sum of the counts of the counters 3 and 4 also becomes zero (see section (g) in FIG. 3. When the decoding circuit 2 decodes the second run length code to produce an output "1011" (11 in decimal representation) and a load pulse 114, decimal 3 is stored in the counter 3 while decimal 2 is stored in the counter 4. Thus, continuous black decoded data having 3+2×4=11 bits are required. Thus the sum of the contents of the counters 3 and 4 becomes decimal 11 as shown at (g) in FIG. 3. As 2 is stored in the counter 4 the carry signal 115 shown in FIG. 1 becomes "0" as shown at (e) in FIG. 3 and according to the output of the inverter 5 the output signal from the selector 7 becomes a fixed value "100", that decimal 4 (see section (h) in FIG. 3).

Now the state of the flip-flop circuit 8 is reversed by the load pulse 114 so that the flip-flop circuit 8 produces an output "1111" and as a result a signal "1111" is inputted, as shown at (l) in FIG. 3, to the input terminals I4 to I7 of the first shifter 71 shown in FIG. 2. A signal "000" outputted from the register 74 are inputted to the input terminals I1 to I3 of the first shifter 71 (see (l) in FIG. 3). On the other hand, a signal "000" is inputted to the input terminals I7 to I5 of the second shifter 72, while a signal "1111" is inputted to the input terminal I4 to I1 of the second shifter 72. FIG. 3 also shows at section (l) the logic states of the input terminal I7 to I1 of the shifter 72 at this time.

The modulo computing circuit 73 adds together, in a modulo fashion, the binary value "100" of the input signal 141 and the binary value "11" of the output signal of the register 75 to set a signal "11" (decminal 3) in register 75 (see section (i) in FIG. 3). Furthermore, the modulo computation circuit 73 produces a carrier signal 173a to enable the gate circuit 76 so as to send a write pulse 109 to the picture memory device 11. Since, at this time, the output of the register 75 has a value 3, the outpt terminals Oe to O1 of the second shifter 72 output "0001" bounded by thick lines at (l) in FIG. 3 because input terminals I7 to I4 are connected to output terminals O4 to O1. Thus, 4 bits corresponding to the sum of previous surplus 3 bits and the upper one bit at this time are outputted. The memory device 11 stores in parallel the 4 bits of the output signal 150 from the second shifter 72 according to the write pulse 109. The remaining 3 bits are outputted from the output terminals O1 to O3 through input terminals I5 to I7 of the first shifter 71 and stored in the register 74 according to the shift number 4 represented by the input signal 141.

A signal "1111" is inputted to the input terminals I4 to I7 of the first shifter 71 according to the next clock pulse and the output "111" of the register 74 is applied to the input terminals I1 to I3 so that seven bits applied to the input terminals I1 to I7 of the first shifter 71 become all "1" as shown at (l) in FIG. 3. In the same manner, the modulo computing circuit 73 adds a value 4 shown by the input signal 141 to the output 3 from the register 75 to set surplus 3 in the register 75. The modulo computing circuit 73 also produces a carry signal 173a to produce a write pulse 109 from the gate circuit 76. At this time, since the output of the register 75 is 3, in the shifter 72, input terminals I7 to I4 are respectively connected to the output terminals O4 to O1 to output in parallel signals each comprising 4 bits from the output terminals O4 to O1. Accordingly, "1" is written into the picture memory device 11 with 4 bits in parallel. The surplus 3 bits "111" which have been inputted to the input terminals I5 to I7 of the first shifter 71 are supplied to output terminals O1 to O3 according to a value 4 represented by the input signal 141 and then stored in the register 74.

During this interval, the counter 4 counts down in response to the clock pulse and its count becomes zero when it counts two clock pulses so as to produce a carry signal 115 as shown at (e) in FIG. 3. As a consequence, the output of the inverter 6 becomes "0" to stop the down counting, and the selector 3 selects and outputs a decimal output 3 of the counter 3. Accordingly, the number of effective data represented by a signal 141 at the next clock pulse is 3 and the logic at the input terminals I4 to I7 of the shifter shown in FIG. 1 is "111X". The symbol "X" is actually "0" but since it will become invalid later, it is designated X at this stage. Since the output "111" from the register 74 is inputted to the terminals I1 to I3, the logic at the input terminals I1 to I7 of the first register 71 becomes "111111X" as shown at (l) in FIG. 3. As a consequence, the logic at the terminals I7 to I1 of the second shifter 72 is the same.

The modulo computing circuit 73 adds together the number 3 of the effective data represented by a signal 141 and the output value 3 of the register 75 to produce a carry signal 173a so as to enable the gate circuit 76 for producing a write pulse 109. At this time, according to the output value 3 of the register 75, since the input terminals I7 to I4 of the second shifter 72 are connected respectively to output terminals O4 to O1, the output signal 150 will have 4 bits in parallel. The modulo sum 2 of the modulo computing circuit 73 is set in the register 75 (see section (i) in FIG. 3). In accordance with the value 3 of the input signal 141, the input terminals I4 to I6 of the first shifter 71 are connected to output terminals O1 to O3 respectively to set a signal "111" in the register 74.

Then, the decoding circuit 2 decodes the next run length code to produce a load pulse 114 to thereby set decimal 2 in counter 3 and decimal 2 in counter 4. Thus, the sum is 2×4+2=10. The selector 7 outputs a fixed value 4 during two clock pulse periods, while at the third clock pulse, outputs 2 (see FIG. section (h) in 3). Now the state of the flip-flop circuit 8 is reversed by the load pulse 114 to output "0000". This signal "0000" is inputted to the input terminals I4 to I7 of the first shifter 71 shown in FIG. 2, whereas a signal "111" is applied to the input terminals I1 to I3. Thus, as shown at (l) in FIG. 3, the logic of the input terminals I2 to I7 is "110000". Accordingly, the logic of the input terminals I6 to I1 of the second shifter 72 is the same. The modulo computing circuit 73 adds the effective data number 4 represented by the input signal 141 to the output value 2 of the register 75 to produce a carry signal 173a which causes the gate circuit 76 to send a write pulse 109 to the picture element memory device 11. At this time, in accordance with the output value 2 of the register 75, input terminals I6 to I3 of the second shifter 72 are connected to output terminals O4 to O1 respectively so that a signal "1100" bounded by thick lines at (l) in FIG. 3 is outputted as four bits in parallel, and written into the picture memory device 11. On the other hand, in accordance with the value 4 of the input signal 141, the input terminals I2 to I7 of the first shifter 71 are connected to output terminals O1 to 3 respectively so that a signal "000" would be stored in the register 74.

In response to the next clock pulse, a signal "0000" is inputted to the input terminals I4 to I7 of the first shifter 71, while a signal "000" is applied to the input terminals I1 to I3 from the register 74. Accordingly, the input terminals I6 to I1 of the second shifter 72 are "0000" and according to the output value 2 of the register 75, a signal with 4 bits in parallel is outputted from the output terminals O4 to O1. The modulo computing circuit 72 adds together the value 4 of the input signal 141 and the value 2 of the register 75 to produce a carry signal 173a which causes the gate circuit 76 to produce a write pulse 109. In response to this pulse the output signal 150 of the second shifter 74, 4 bits in parallel, is written into the picture memory device 11. In other words, a signal "0000" is written.

At this time, the count of the counter 4 becomes zero and the carry signal 115 becomes "1" see section (e) in FIG. 3) so that the output of the inverter 5 becomes "0" (see section (f) in FIG. 3) with the result that the selector 7 selects and outputs the output of the counter 3. Thus, the value of the signal 141 becomes 2 (see section (h) in FIG. 3). Consequently, the modulo computing circuit 73 adds together the value 2 of the input signal 141 and the output value 2 of the register 75 to produce a carry signal 173a which causes the gate circuit 76 to output a write pulse 109. At this time, the output value of the register 75 is 2 so that the second shifter 72 connects its input terminals I6 to I3 to output terminals O4 to O1 respectively. A signal "00" is inputted to the input terminals I6 and I5 of the second shifter 72 from the register 74, while the output signal "0" of the flip-flop circuit 8 is inputted to the input terminals I4 and I3 so that the output signal 168 from the shifter 72 is "0000" with the four bits in parallel, and this output signal is written into the picture memory device 11. The result of computation of the modulo computing circuit 73 is 2+2=0 so that "0" is set in the register 75 (see section (i) in FIG. 3).

By the operations described above, in the picture memory device 11 are written with "0" of 3 bits, "1" of 11 bits and "0" of 10 bits. Each time the decoded data of the effective number m represented by signal 141 are rearranged to have 4 bits, the writing of the picture memory device 11 is made while surplus decoded data are being stored in the register 74 and combined with the next decoded data to form data having four bits in parallel. When decoding of one line is completed and when decoding circuit 2 decodes an one line termination code EOT, an one line termination signal 121 shown at (b) in FIG. 3 is outputted. Accordingly, the timing pulse generator 9 again produces a start pulse 120 to commence the decoding operation of the next line.

Although in the foregoing description, it was assumed that n=4, m may be any integer. According to this invention, at the second step of decoding, the N-bit decoded data are generated (k+1) times, that is, during the (k+1) clock intervals. Where it is assumed that the means run length is 50 and n is 8, the mean value of k is 6 so that it is possible to decode with 7 clock intervals. More particularly, it is possible to generate the decoded data at a rate of about 7 bits in one clock interval. Accordingly, assuming a clock frequency of 10 megahertz, the time T2 of the second step is 0.06 sec., so that codes of one picture can be decoded in 0.1 sec. which is the sum of the times T1 and T2 of the first and second steps.

The array conversion circuit 10 shown in FIG. 2 was described such that it converts parallel input data 140 of 4 bits (including invalid data) into 4-bit parallel output data 150 excluding the invalid data, it will be clear that the array conversion circuit 10 can convert n bits of the input data (including invalid data) into 4-bit parallel output data excluding the invalid data. In this case, the first shifter 71 has a number of input terminals of (n+1−1) bits, a maximum number of shifts of n, and the number of the output terminals of (l−1) bits, while the second shifter 72 has a number of input terminals of (2l−1) bits, a maximum number of shifts of (l−1), and a number of output terminals of bits. In this case, the surplus bit storing register 74 may have (l−1) bits, and an accumulator for counting the number of the surplus bits, and a computation circuit having a modulo l are added. However, in order to prevent accumulation of surplus bits causing overflow, it is desirable that $l \geq n$. For example, where l=8, n=8 and a sampling speed is 10 megahertz, it is possible to decode at a maximum speed of 80 mega bits/sec. Thus, this modification is extremely suitable for high speed processing.

Furthermore, in the foregoing embodiment, the decoded data 140 applied to the array conversion circuit 10 comprise 4-bit parallel data which is alternately reversed between "0" and "1" at each run by the flip-flop circuit 8, but where the decoded data for a run length N comprises (N−1) "0" and one "1" (conversion point becomes "1"), a pattern generator can be substituted for the flip-flop circuit so as to generate a pattern corresponding to the output 141 of the selector 7. For instance, when the signal 141 is 4, the pattern generator is designed to generate "0001", whereas when the signal 141 is 3, 2 and 1, the pattern generator generates patterns "001", "01" and "1" respectively.

Although the foregoing embodiment can operate with a sufficiently short decoding time when the compression ratio of the run length code is high, where the compression ratio is low, it is necessary to shorten the processing time of the decoding circuit 2. To this end, the decoding circuit 2 may be constructed as of a parallel input type as will be described hereunder.

Figure 4:
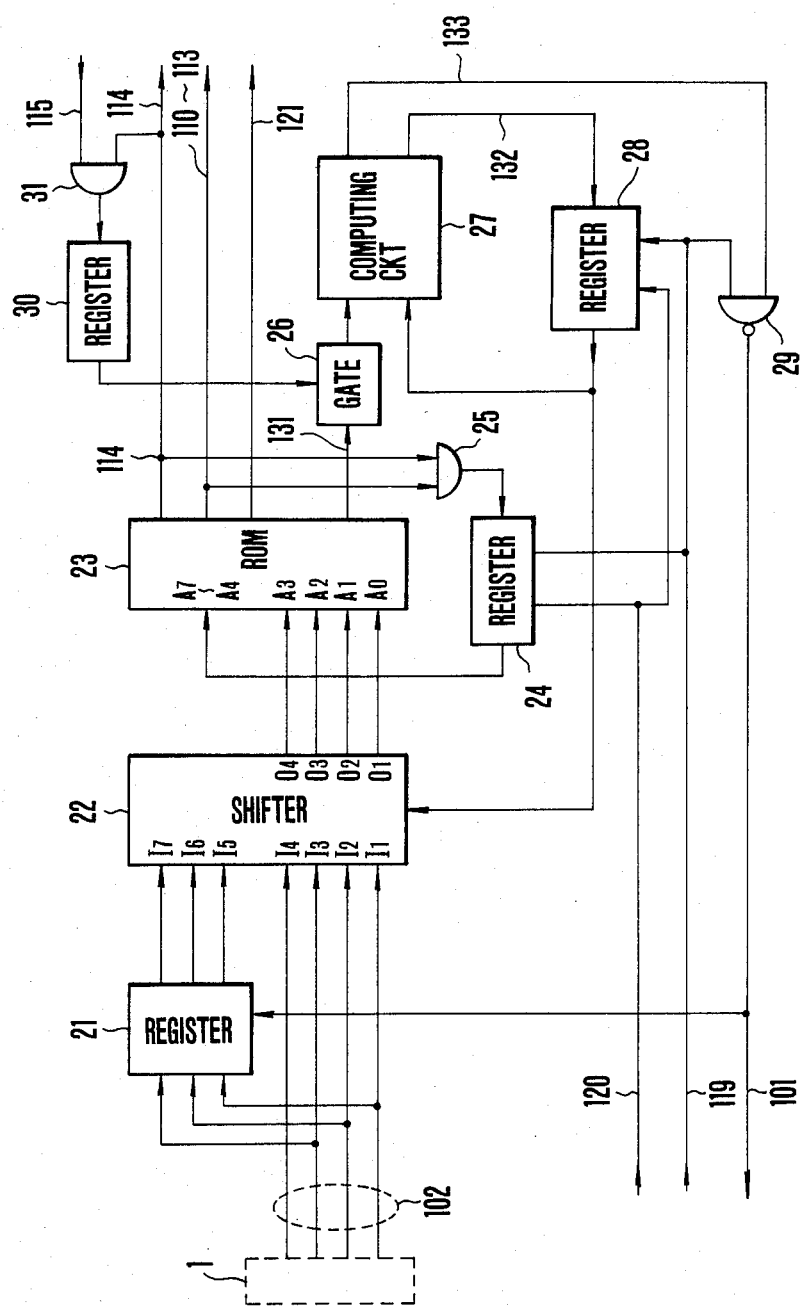
FIG. 4 is a block diagram showing one example of a parallel decoding circuit for effecting the decoding at a higher speed.

FIG. 4 shows one example of a decoding circuit of the parallel type capable of decoding at high speeds. In this case, the output signal 102 from the memory device 1 comprises 4-bit parallel data, for example, and the output signal 102 is supplied to the register 21 and the terminals I4 to I1 of a shifter 22. The output of the register 21 is applied to the input terminals I7 to I5 of the shifter 22, the number of shifts thereof being controlled by the output of a register 28 to be desdribed later. The output terminals O4 to O1 are connected to address terminals A3 to A0 of a ROM 23, while the address terminals A7 to A4 thereof are supplied with the output signal of a register 24. The run length output signals 110 to 113 of ROM 3 are applied to the input terminal of the register 24 through a gate circuit 25 controlled by a load pulse 114 outputted from the ROM 23. The timing of the output of a gate circuit 31 inputted with the load pulse 31 and a carry signal 115 is adjusted by a register 30 so as to control the gate circuit 26 with the output of the register 30. The gate circuit 26 is disabled by a clock pulse succeeding the load pulse to temporarily stop the decoding operation for the purpose of forcibly reducing to zero a code length data n' to be described later. The code length data n' outputted from the ROM 23 is supplied to a computing circuit 27 via the gate circuit 26. The computing circuit 27 computes this input and the output of register 28 and stores the result of computation in a register 28, the output thereof being used to control the number of shifts of the shifter at the next clock pulse. Where the number of shifts outputted from the register 28 is designated by m', the computing circuit 27 calculates m'−n', and when m'−n'>0, it produces Y1=m'−n' on an output lines 132 and Y2="0" on an output lines 133. Where m'−n'<0, the results of calculations are Y1=m'−n'+4 and Y2="1". The signal Y2="1" causes the gate circuit 29 to output a read out pulse 101. As shown in FIG. 7, at address positions represented by address terminals A7 to A1 are prestored the decoded run length representing whether outputting a load pulse is necessary or not, code length n' and an one line termination signal representing whether the signal is the one line termination signal or not. The code length n' shows the length of a decoded portion of the length of a compressed data code.

The decoding operation of the modification shown in FIG. 4 will be described as follows. As a presupposition, it is assumed that the code words of compressed code for run lengths 1 to 15 are defined as shown in FIG. 5 in which the code lengths of respective code words re shown in the righthand column. The one line termination code EOL is "00000001" and has a code length of is 8.

Where compressed codes having code lengths of 3, 11 and 10 are stored in the memory device 1 in the order mentioned, FIG. 5 shows that the compressed codes are "10", "0000101" and "0000100" and the one line termination code "00000001" is added thereto. When a series of compressed codes are read out of the memory device 1 with four bits in parallel, the first read-out signal 102 is "1000", followed by "0010", "1000" and "0100". The one line termination code EOL is read out in two portios "0000" and "001".

A line start pulse 120 is applied to the registers 24 and 28 to make zero their outputs whereby the decoding circuit begins to decode. The 4-bit parallel data "1000" firstly read out of the memory device 1 is inputted to the input terminals I4 to I1 of the shifter 22 as shown at section (b) in FIG. 6. As a consequence, the output terminals O4 to O1 of the shifter 22 output "1000" which is supplied to the address terminals A3 to A0 of ROM 23. At this time, address terminals A7 to A4 are "0". A table as shown in FIG. 7, for example, is stored in the ROM 23 corresponding to the run length code words shown in FIG. 5. Consequently, run length of 3, code length n'=2, and load pulse "0" are read out of corresponding address positions. The signal run length 3 is applied to the counters 2 and 3 (FIG. 1) via output lines 110 to 113 and stored in the counters 2 and 3 according to the load pulse "0". Since the gate circuit 25 is closed by the load pulse "0", the content of the register 24 is still "0". The signal code length n' is sent to the computing circuit 27 via the gate circuit 20 so that the computing circuit 27 produces Y1=m'=n'+4=2 on output line 132 and Y2=1 on output line 133. Consequently, 2 is set in the register 28 and the gate circuit 29 is enabled to send a read-out pulse 101 shown at (a) in FIG. 3 to the memory device 1.

As shown at (b) in FIG. 6, the next 4-bit parallel data "0010" read out of the memory device "1" is applied to input terminals I4 to I1 of the shifter 22. At this time, the register 21 is storing lower 3 bits "000" of previously inputted data and these 3 bits are applied to the input terminals I7 to I5 of the shifter 22 (see section (b) in FIG. 6). Since the shift number m' outputted by the register 28 is 2, the shifter 22 connects its input terminals I6 to I3 to output terminals O4 to O1. As a consequence, the output terminals O4 to O1 of the shifter 22 output 4 bits "0000" bounded by thick lines shown at (b) in FIG. 6. Since the address terminals A7 to A4 of ROM 23 are inputted with the output "0000" from the register 24, a run length 2 is outputted on signal lines 110 to 113, and a code length 4 is outputted on signal line 131 according to the table shown in FIG. 7. However, decoding of the compressed code is not yet completed, no load pulse 114 is produced (its logic value is "1"). Thus, the run length when no load pulse 114 is outputted means that the decoding is on the way, and the run length 2 at this time is stored in register 24 via the gate circuit 25 and then fed back to addresses A7 to A4 of the ROM 23 at the next clock pulse. At the next clock pulse, a signal "1000" is inputted to input terminals I4 to I1 of the shifter 22. Since the output of the register 21 is "010" (see section (b) in FIG. 6 and since the output of the register 28 is 2, the output terminals O4 to O1 output bits "1010" bounded by thick lines shown at (b) in FIG. 6, which are inputted to address terminals A3 to A0 of ROM 23. At this time, the output 2 of the register 24, that is, binary "0010" is applied to the address terminals A7 to A4 of ROM 23. Accordingly, ROM 23 outputs run length 11 (decimal representation), a load pulse "0" and code length 3 according to the table shown in FIG. 7. A decimal 11 is outputted on signal lines 110 to 103 and stored in counters 3 and 4 according to a load pulse 114. In the same manner, the next run length 10 decimal) is decoded and finally, when an EL code appears, the one line decoding terminals.

Since the decoding circuit described above can decode a compressed code having 4 bits at the maximum, it can operate at a high speed. The number of parallel input data to be decoded at a time is not limited to 4 bits, and any number can be selected. Instead of decoding the codes and generating decoded codes at different times, these operations can be executed parallelly at the same time.

As described above, according to this invention, the run length decoded data are generated with n bits in parallel (or l bits larger than n) so as to write them in parallel into a picture memory device 11 so that the decoding processing can be executed at a high speed. By adding a parallel decoding circuit to a decoding circuit that decodes compressed data, the processing speed can be increased further.

Figure 8:
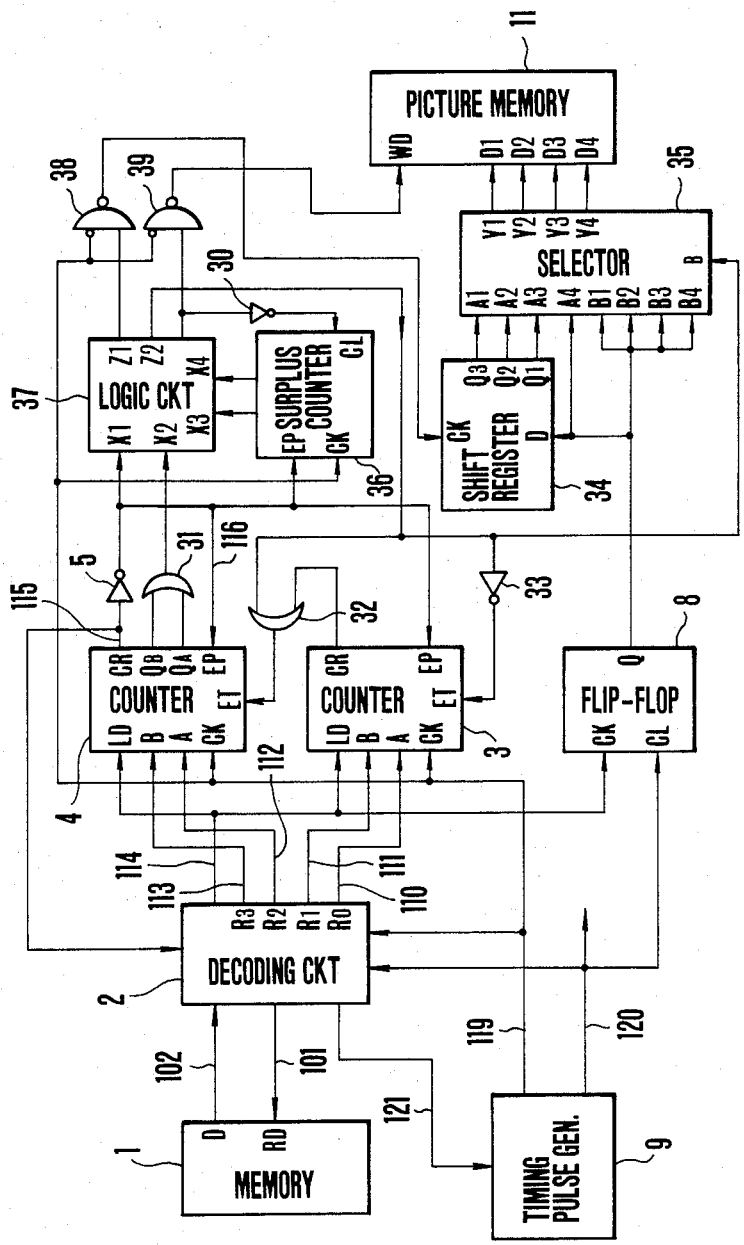
FIG. 8 is a block diagram showing a modification of this invention.

In a modification shown in FIG. 8, memory device 1 decodig circuit 2 flip-flop circuit 8, and timing pulse generator 9 are identical to those shown in FIG. 1. Two counters 3 and 4 are connected to receive similar outputs from the decoding circuit 2 as the counters 3 and 4 shown in FIG. 1 but the connections of their outputs and other circuit elements to be described later are different.

More particularly, the number of bits m of the counter 3 corresponds to the number of bits n to be inputted in parallel to the picture memory device 11. Count enabling terminals EP of counters 3 and 4 are supplied with a signal "1". When a signal "1" is applied to terminals EP of the counters 3 and 4, they count down by one each time clock pulse 119 is applied to their clock terminal CK. When their counts reduce to zero, they produce carry signals at their CR terminals. The carry signal produced by counter 3 is applied to the terminal ET of the counter 4 via an OR gate circuit 32. The carry signal 115 produced by the counter 4 is fed back to the decoding circuit 2 to act as a decoding completion signal and supplied to the terminals EP of the counters 3 and 4 via an inverter 5. Consequently, as the counts of counters 3 and 4 reduce to zero, the carrier signal 115 becomes "1" and the output of the inverter 5 becomes "0" whereby the counter 5 stops its counting operation.

A logic circuit 37 is provided having 4 input terminals X1 to X4 and three output terminals Z1 to Z3 and the logic relation between inputs and outputs are given by the following equations:

$$Z1 = X \cdot (X2 + X2 + X4) \quad (1)$$

$$Z2 = X2 \cdot X3 \cdot X4 \quad (2)$$

$$Z3 = X1 \cdot X3 \cdot X4 + X2 \cdot X3 \cdot X4 \quad (3)$$

To the input terminals X1 is inputted the output of the inverter 5, and to the input terminal X2 are applied two bit outputs QA and QB of the counter 4 via an OR gate circuit 31. A two bit outputs of a surplus counter 36 are inputted to the input terminals X3 and X4 of a surplus counter 36. The fact that input X1 is "1" means generation of a decoded data and the fact that X1 is "0" means that the compressed data are being decoded so that decoded data are not produced. The fact that X2 is "0" means that the number of data to be decoded is less than 4, and the fact that X2 is "1" means that the number of data to be decoded is larger than 4. An equation X3=X4 ="0" shows that there are no surplus data which have been decoded, while an equation X3=X4="1" shows that 3 surplus decoded data are remaining in the register 34.

The output from the output terminal Z1 of the logic circuit 37 is inputted to one input terminal of a NAND gate circuit 38 and when the output is "1", the NAND gate circuit 38 is enabled to apply a clock pulse 119 generated by the timing pulse generator 9 to the clock terminal CK of a shift register 34. The output of the output terminal Z2 of the logic circuit 37 is applied to the ET terminal of the counter 4 via an OR gate circuit 32 and to the terminal ET of the counter 3 via an inverter 33. This output is also applied to the selection terminal S of a selector 35 to act as a selection control signal. The output from the output terminal Z3 of the logic circuit 37 enables a NAND gate circuit 39 to apply the clock pulse 119 to the write control terminal WD of the picture memory device 11. Further the output of the output terminal Z3 is applied to the clear terminal CL of the surplus counter 36 via an inverter 30.

The shift register 34 sets therein and shifts logic state applied to its input terminal D in accordance with a shift clock pulse passing through the NAND gate circuit. The logic of the terminal D of the shift register 34 is given by the Q output of the flip-flop circuit 8, the state thereof being alternately reversed at each run by the load pulse 114 outputted from the decoding circuit 2. The Q output of the flip-flop circuit 8 is also applied to the terminals B1 to B4 and A4 of the selector 35. The terminals A1 to A3 of the selector 35 is connected to the terminals Q3 to Q1 respectively of the shift register 34. In accordance with the output signal from the output terminal Z2 of the logic circuit 37 and supplied to the selection terminal S, the selector 35 selects either one of the groups of input signals applied to terminals A1 to A4 and terminals B1 to B4 to output in parallel selected signals through output terminals Y1 to Y4. The picture memory device 11 is supplied with parallel output signals from the output terminals Y1 to Y4 of the selector 35 at its input terminals D1 to D4 to store the inputted signals according to the write pulse supplied from the NAND gate circuit 39. In addition to the timing pulse 119, the timing pulse generator 9 generates a line start pulse 120 in accordance with one line termination signal supplied from the decoding circuit 2. The line start pulse 120 resets or clears the flip-flop circuit 8 and the surplus counter 36 so as to permit the decoding circuit 2 to start decoding operation.

The operation of the modification shown in FIG. 8 will now be described with reference to FIG. 9. When the timing pulse generator 9 produces a line start pulse 120 as shown at section (a) in FIG. 9, the flip-flop circuit 8 and the surplus counter 36 are cleared to their initial states so that the decoder 2 starts its operation. The decoder 2 applies a read pulse 101 to the terminal RD of the memory device 1 to read out and decode the compressed data stored therein. When the first run length is decoded, the decoding circuit 2 outputs a load pulse 114 as shown at (d) in FIG. 9 to load binary run length data in the counters 3 and 4. It is now assumed that the run length of the first white signal is 3, that the run length of the second black signal is 11 and that the run length of the third white signal is 6. Since the output of the decoding circuit 2 corresponding to the first run length is "0011" binary "11" is loaded in the counter 3 and binary "00" is loaded in counter 4. As the counters 3 and 4 is used such synchronous counter as type μp B 74163 sold by the assignee of this application, and data are loaded in the counter when a clock pulse succeeding the load pulse rises. Since the clock pulse is shown at (c) in FIG. 9, the data "11" (decimal 3) are loaded in the counter at a time shown at (f) in FIG. 9.

As the datum 3 is loaded in the counter 3, its CR output would become "0" and the logic of the ET terminal of the counter 4 would become "0". Each of the counters 3 and 4 outputs "1" at the carry output terminal CR when a signal applied to ET input is "1" and the count is zero, but outputs "0" at the carry output terminal CR in other states, so that the CR output of the counter 4, that is, the carry signal 115 becomes "0" as shown at (e) in FIG. 9. As shown at (f) in FIG. 9, the content of the counter 3 is decremented by one of each clock pulses so that the content becomes zero at the third clock pulse. When the content of the counter 3 reduces to zero, the carry output CR becomes "1" which is applied to the ET terminal of the counter 4 via OR gate circuit 32. Since the content of the counter 4 is zero, the carry output CR supplies a carry signal of "1".

When the carry signal 115 becomes "1", the output of the inverter 5 becomes "0" to apply a logic "0" to the ET terminals of the counters 3 and 4 to stop their counting operations. Consequently, as shown at (e) in FIG. 9, the carry output 115 becomes "0" for three clock pulse periods. During this interval, the logic of the input terminal X1 of the logic circuit 37 is "1", that of the input terminal X2 is "0", and those of input terminals X3 and X4 are not "11". From equations (1) to (3), Z1="1", Z2="0" and Z3="0". Accordingly, the NAND gate circuit 38 is enabled to input 3 clock terminals to CK terminal of the shift register 34 as shown at (h) in FIG. 9. At this time, since the Q output of the flip-flop circuit 8 is "0" representing a white signal and the terminal input of the shift register 34 is "0", at each shift clock pulse, a signal "0" is applied to the terminal D of shift register 34 to sequentially shift the "0", thus producing "0" and each of the output terminals Q3 to Q1. The outputs of these terminals are applied to the input terminals A1 to A3 of the selector 35 respectively. Since the Z2 output of the logic circuit 37 is "0", selector 35 selects input signals to the input terminals A1 to A4 and outputs the inputted signals at output terminals Y1 to Y4. At this time, however, since the NAND gate circuit 39 is disabled, no write pulse is inputted to the picture memory device 11. More particularly, while the Z3 output is "0" showing that 4 bits of the decoded data are present, no decoded data are written into the picture memory device 11. At this time, since the EP terminal of the surplus counter 36 is "1", it counts the number of clock pulses 119 inputted to the CK terminal as shown at (g) in FIG. 9. At the third clock signal, the count of the counter 3 becomes zero and the carry signal changes to "1", whereby the output of the inverter 5 becomes "0" and the count of the surplus counter 36 becomes 3. At this time, in the logic circuit 37, X1="0", X2="0", X3="1" and X4="1" and the output Z3 is still "0". Now it becomes X2="1" and X4="1" showing that 3 decoded surplus data are remaining in the register 34.

Figure 9:
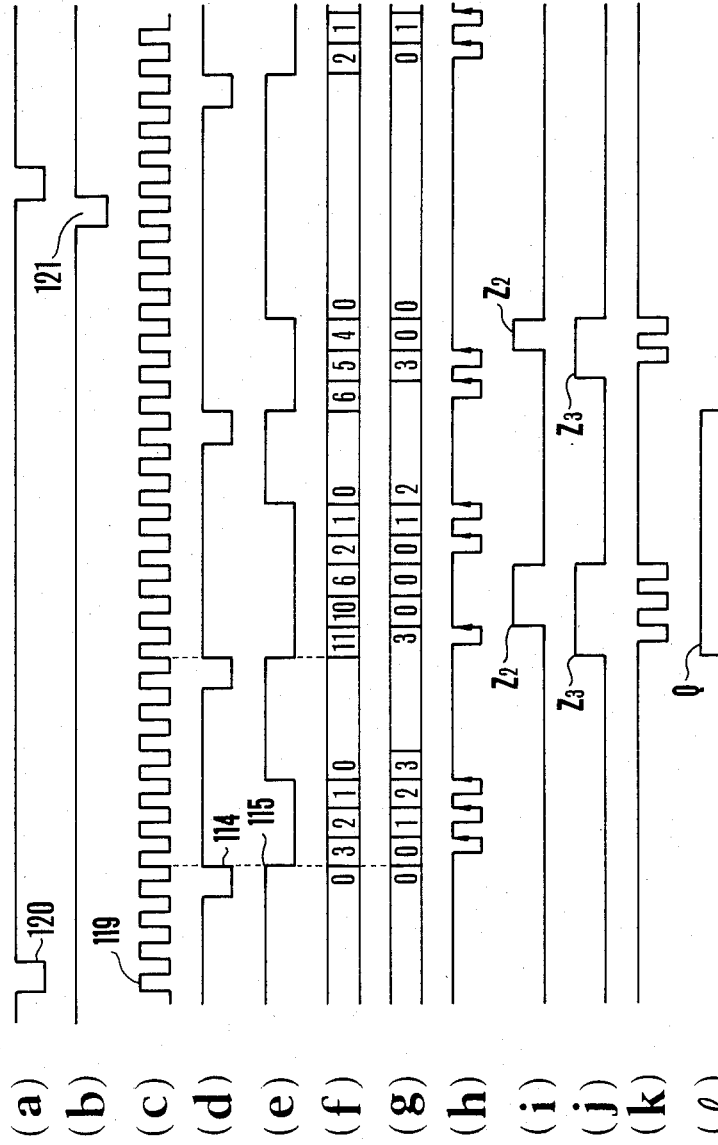
FIG. 9 shows a timing chart useful to explain the operation of the modification shown in FIG. 8.

When the carry signal 115 becomes "1", the decoding circuit 2 begins to decode the next run length to produce binary data on the output lines 110 to 113 and a load pulse shown at (d) in FIG. 9 which is loaded in counters 3 and 4. At this time, since the run length is decimal 11, 3 is stored in counter 3 while 4 in counter 4. In total, decimal 11 is stored in the counters 3 and 4, and the carry signal 115 then becomes "0" as shown at (e) in FIG. 9. Accordingly, the output of the inverter 5 becomes "1" and the signal to the input X1 of the logic circuit 37 becomes "1". Since at this time, X1="1", X2="1", and X3=X4="1", as shown at (j) in FIG. 9, the output Z2 of the logic circuit 37 becomes "1" to enable the NAND gate circuit 39. As a consequence, a write pulse is applied to the picture memory device as shown at (k) in FIG. 9. Since a signal "0" is applied to the input terminals A to A4 from the output terminal Z2 of the logic circuit 37, the selector 35 applies input signals to the input terminals A1 to A4 to the output terminals Y1 to Y4. Outputs Q3 to Q1 (all "0") of the shift register 34 are applied to the input terminals A1 to A4 so that Q output of "1" of the flip-flop circuit 8 is applied to the input terminal A1 as shown at (l) in FIG. 2 because the state of the flip-flop circuit 8 has been reversed by the load pulse 114. As a consequence, the output terminals Y1 to Y of the selector 35 produce a signal "0001" which is set in the picture memory device 11 with the four bits in parallel. In response to the next clock pulse, the counter 3 decrements by one and the sum of the counts of the counters 3 and 4 becomes 10 as shown at (f) in FIG. 9. The Z3 output of "1" is inverted by the inverter 30 to clear the surplus counter 36 to thereby reduce its count to zero as shown at (g) in FIG. 9 and the signals to input terminals X3 and X3 of the logic circuit 37 both become "0". This shows that there is no surplus in the decoded data. As a consequence, as shown at (j) in FIG. 9, the output Z2 becomes "1". Then signal "1" is applied to the terminal ET of the counter 4 via the OR gate circuit 32, while "0" is applied to the terminal ET of the counter 3 via inverter 33. At this time, since the output of the inverter 5 is "1" and "1" is applied to the EP terminal of the counter 4, the count of the counter 4 is decreased by 4 at each clock pulse. Thus, as shown at (f) in FIG. 9, the count decreases as 10→6→2. During this time, according to the output Z2 as shown at (i) in FIG. 9, the selector 35 selects signals applied to input terminals B1 to B4 and outputs the inputted signals from pnputput terminals Y1 to Y4, and input terminals D1 to D4 of the picture memory device 11 are simultaneously written with 4 bits at each write pulse supplied from the NAND gate circuit 39. Since such writing is done twice, consecutive 8 black data would be written. As the count of the counter 4 becomes zero, the input X2 of the logic circuit 37 becomes "0". At this time, since X1="1", output terminal Z1 becomes "1" to enable NAND gate circuit 38 to pass the clock pulse 119, whereby two shift clock pulses are inputted to the shift register 34, which writes and shifts the output "1" of the flip-flop circuit 8 of each clock pulse. Meanwhile, the surplus counter 36 counts two clock pulses so that its count becomes 2 as shown at (g) in FIG. 9 and the counter 3 counts down at each clock pulse to reduce its count to zero as shown at (f) in FIG. 9. When the count of the counter 3 reduces to zero the carry signal 115 becomes "1" (see section (e) in FIG. 9) so that the decoding circuit 2 starts the next decoding operation to load the result of decoding in counters 3 and 4. The value now loaded is 6 as shown at (f) in FIG. 9. As 6 is loaded in the counters, the carry signal 115 becomes "0" (section (e) in FIG. 9) while the signal inputted to the input terminal X1 of the logic circuit 37 becomes "1". At this time, X2=1, X3=0 and X4=1. Consequently, the outputs of the logic circuit 37 are Z1=1, Z2=0 and Z3=0 whereby a shift clock pulse is outputted but a write pulse is not. At this time, since the output of the flip-flop circuit 8 has been changed to "0" (section (e) in FIG. 9), a signal "0" is applied to the input Q1 of the shift register 34 and signals "1" previously applied are shifted to output terminals Q2 and Q3. The outputs of the terminals Q3 to Q1 of the shift register 34 become "110". The sum of the counts of the counter 3 and 4 is 5 (section (f) in FIG. 9) and the count of the counter 36 is 36 (section (g) in FIG. 9). As the count of the surplus counter 36 becomes 3, since X3="1" and X4="1", Z3 becomes "1" (FIG. 9, (j)) thus outputting a write pulse (FIG. 9, (k)). At this time, since the selector 35 selects and outputs the inputs to input terminals A1 to A4, that is, "1100" at the time when Z2="0". This signal "1100" is written into the picture memory device 11. At the next clock pulse, the count of counter 3 is decremented one to become zero so that the count of the surplus counter 36 is cleared to zero. Thus, X3="0" and X4="0" and Z2="1" (FIG. 9, (i)). When the output Z2 becomes "1", the ET terminal of the counter 3 becomes "0" while the ET terminal of the counter 4 becomes "1". When the output Z2 becomes "1", selector 35 selects signals applied to inputs B1 to B4 and outputs them to output terminals Y1 to Y4. Since, at this time the output of the flip-flop circuit 8 is "0", output terminals Y1 to Y4 produce a signal "0000". According to the next write pulse, this signal "0000" is written into the picture memory device 11 while the content of the counter 4 is decremented 4 to become zero (FIG. 9 (f)), thereby producing a carry signal 115 which changes a signal to input X1 to "0". Since the input to X2 is also "0", outputs Z2 and Z3 also become "0" (FIG. 9, (i)), and the decoding circuit 2 commences the next decoding operation. When the decoding circuit 2 decodes an EOL code showing the end of one line, it sends one line termination signal 121 as shown at (b) in FIG. 9 to the timing pulse generator 9, thus completing the decoding of one line. Thereafter, the timing pulse generator 9 generates again the line start pulse to execute the decoding of the next line in the same manner as described above.

Summarizing the above-described operation, the decoding circuit 2 decodes a compressed code to output binary datum indicative of the run length. A binary datum is divided into lower order 2 bits (when the member of bits simultaneously written in the picture memory device 11 is 4) and upper order 2 bit, and these lower and upper bit are loaded in the counters 3 and 4 respectively. When the count of the counter 3 is not zero, that is, when there is a surplus less than n bits and when the content of the counter is zero, the output "0" or "1" (meaning white or black) of the flip-flop circuit 8 at that time is written into the shift register 34. The white or black information written into the shift register 34 is counted by the surplus counter 36 while the count of the counter 3 is counted down by one each time a signal is written into the shift register 34. The white and black information held in the shift register 34 corresponds to decoded data and a surplus less than 4. As the decoded data become to have 4 bits, a 4-bit output is produced by the selector 35 and written into the picture memory device 11 with 4 bits in parallel. At the same time, the surplus register 36 is cleared. When a surplus remains in the surplus register 36, the data are decoded bit after bit and accumulated in the shift register 34 even when the count of the counter 4 is not zero, i.e., when the number of data to be decoded has more than n bits. When the decoded data become to have all 4 bits, the decoded data are written into the picture memory device with 4 bits in parallel. At this time, if the content of the counter 4 is not zero, the selector 35 selects its four inputs B1 to B4 and writes the selected 4 bits into the picture memory device 11. Similar writing is continued until the count of the counter 4 is reduced to zero, after the count of the counter 4 has been reduced to zero, the signal is written into the shift register 34 until the count of the counter 3 becomes zero. When the count of the counter 3 has reduced to zero, the counter 4 produces a carry signal 115 which is sent to the decoding circuit 2 to execute the next decoding.

The control described above is performed by determining the outputs Z1 to Z3 according to combinations of logics of 4 signals inputted to input terminals X1 to X4 to enable and disable gate circuits 38 and 39 so as to clear the surplus counter 36.

More particularly, in this modification, the surplus decoded data having less than 4 bits are accumulated in the shift register 34 and are added to the next decoded data. When the sum of the bits reaches 4, the data are written into the picture memory device. In the absence of surplus data of less than 4 bits, the 4 bits are grouped and the group is decoded and then written into the picture memory device 11. However, when the data to be decoded contains less than 4 bits, each bit is decoded and then accumulated in the shift register 34. Consequently, it is possible to decode at much higher speed than the prior art system in which all decoded data are written in a memory device bit after bit.

For the sake of description, although in the foregoing embodiment, the number of bits parallelly written into the picture memory element was selected to be 4, in practice about n=8 is suitable. In this case, the counter 3 and the surplus counter 36 are 3 bit counters and the constructions of the shift register 34, selector 35 and logic circuit are modified correspondingly.

Where n=8, the decoding time T2 at the second step becomes as follows. Since n=8, the mean value of the surpluses is 4. Assuming a mean run length of 56 bits, there are surplus data each containing 4 bit on an average before and after $8 \times 6 = 48$ bits. Accordingly, to decode data having a run length of 5 bits, $4+6+4=14$ clock pulses are necessary. In other words, one clock pulse can produce 4 data on an average. With a clock frequency of 10 Mega H3, it is possible to realize T2=0.1 sec.

As described above, according to this invention, run length encoded compressed data are decoded with a decoding circuit into binary data each representing a run length and each run length is divided into a run length of n bit unit and a surplus run length having less than n bits. The divided run lengths are loaded into separate counters. Furthermore, a shift register is provided to store the surplus of the decoded data. The surplus decoded data are once stored in the shift register. When the surplus decoded data are not stored in the shift register, and when the data to be decoded have more than n bits, n bits regarding white or black information are grouped and then stored in a memory device. In cases other than the above, the data decoded one after one bits and the decoded bits are accumulated in the shift register. When the number of bits of the decoded data reaches 4, the data are written into the picture memory device 11 with n bits in parallel. Consequently, surplus bits before and after a predetermined number of bits are decoded at a rate of n bits per one clock pulse, whereas the surpluses before and after the predetermined number of bits are decoded one after one bit. Accordingly, it is possible to decode at much higher speed than the prior art run length decoding system in which decoded data of the number represented by the output value of the decoding circuit are produced bit after bit. Moreover, the decoding system of this invention is not required to use expensive high speed circuit elements.

What is claimed is:

1. In run length decoding apparatus of the type comprising a decoding circuit which decodes a series of run length encoded data to sequentially output binary data indicative of respective run lengths, and means for decoding a white or black signal having a number of bits represented by an output value of said decoding circuit so as to sequentially accumulate decoded signals in a picture memory device, the improvement which comprises a lower order counter to be set with a surplus less than n (an integer larger than 2) of the output value of said decoding circuit, an upper order counter to be set with an upper order value, counts of said upper order counter being decremented according to a clock pulse, a selector which, in response to a carry signal outputted by said upper order counter selects and outputs either one of a fixed value n and an output signal of said lower order counter at each clock pulse, a flip-flop circuit whose state is reversed at each one run length, and an array conversion circuit inputted with decoded data outputted from said flip-flop circuit and a number of effective data outputted from said selector to sequentially array effective decoded data for outputting them as parallel data each having more than n bits.

2. The apparatus according to claim 1 wherein said lower order counter is substituted by a register.

3. In a run length decoding apparatus of the type comprising a decoding circuit which decodes a series of run length encoded data to sequentially output binary data indicative of respective run length, and means for decoding a white or black signal having a number of bits represented by an output value of said decoding circuit so as to sequentially accumulate decoded signals in a picture memory device, the improvement which comprises a lower order counter set with a surplus of less than n (an integer larger than 2) of the output value of said decoding circuit, an upper order counter to be set with an upper order value, a shift register for storing decoded data of said surplus having less than n bits, a surplus counter for counting a number of decoded data stored in said shift register, a flip-flop circuit whose output is reversed at each one run length, a selector having a 2n-bit input and an n-bit output, and applied with an output of said shift register and an output of said flip-flop circuit, a picture memory device written with said n bit output of said selector, and a logic circuit inputted with an output state of said upper order counter and an output state of said surplus counter for producing an output signal calculated by predetermined logic equations, said output signal of said logic controlling shift operation of said shift register, writing of said memory device, counting operations of said lower order and upper order counters and clearing of said surplus counter, whereby when the decoded data does not contain any surplus less than n bits, and when the data to be decoded contains more than n bits, n bits of the decoded data are grouped and then written into said picture memory device, whereas in other cases data are decoded bit after bit and the decoded bits are accumulated in said shift register, and when a number of bits reaches n, said decoded data are written into said picture memory device with n bits in parallel.

* * * * *

UNITED STATES PATENT AND TRADEMARK OFFICE
CERTIFICATE OF CORRECTION

PATENT NO. : 4,499,498

DATED : Feb. 12, 1985

INVENTOR(S) : Iinuma

It is certified that error appears in the above-identified patent and that said Letters Patent is hereby corrected as shown below:

| COLUMN | LINE | |
|---|---|---|
| 8 | 30 | Delete "74", insert --72--. |
| 10 | 52 | Delete "001", insert --0001--. |
| 12 | 30 | Delete "X2" (first use), insert --$\overline{X}2$--. |
| 12 | 32 | Delete "X3·X4", insert --$\overline{X}3 \cdot \overline{X}4$--. |
| 12 | 34 | Delete "X3·X4" (second use), insert --$\overline{X}3 \cdot \overline{X}4$--. |
| 14 | 66 | Delete "Y", insert --Y4--. |

Signed and Sealed this

Sixth Day of August 1985

[SEAL]

Attest:

DONALD J. QUIGG

*Attesting Officer*  *Acting Commissioner of Patents and Trademarks*